US011872675B2

(12) United States Patent
Perez et al.

(10) Patent No.: US 11,872,675 B2
(45) Date of Patent: Jan. 16, 2024

(54) SYSTEMS AND METHODS FOR INSTALLING A PANEL OF AN ENCLOSURE

(71) Applicant: Hoffman Enclosures, Inc., Anoka, MN (US)

(72) Inventors: Omar Alejandro Rodriquez Perez, Reynosa (MX); Joseph D. Ricke, Ardent Hills, MN (US); David Israel Roque Cabello, Reynosa (MX); Selene Elizabeth Hernandez Ariguznaga, Reynosa (MX)

(73) Assignee: Hoffman Enclosures, Inc., Anoka, MN (US)

( * ) Notice: Subject to any disclaimer, the term of this patent is extended or adjusted under 35 U.S.C. 154(b) by 111 days.

(21) Appl. No.: 17/326,905

(22) Filed: May 21, 2021

(65) Prior Publication Data

US 2021/0362310 A1     Nov. 25, 2021

Related U.S. Application Data

(60) Provisional application No. 63/028,124, filed on May 21, 2020.

(51) Int. Cl.
*B25B 27/14* (2006.01)
*H05K 5/00* (2006.01)

(52) U.S. Cl.
CPC ............ *B25B 27/14* (2013.01); *H05K 5/0008* (2013.01)

(58) Field of Classification Search
CPC .......... B25B 27/14; B25B 27/00; B23P 11/00; B23P 11/005; B23P 19/00; B23P 19/04; H05K 5/0008; H02B 1/32; H02B 1/308

USPC ......... 29/244, 247, 252, 263, 267, 272, 278, 29/280, 281; 254/25, 21
See application file for complete search history.

(56) References Cited

U.S. PATENT DOCUMENTS

| 5,333,950 | A |   | 8/1994  | Zachrai         |           |
|-----------|---|---|---------|-----------------|-----------|
| 5,769,519 | A |   | 6/1998  | Nicolai         |           |
| 6,145,943 | A | * | 11/2000 | Reuter          | H02B 1/32 |
|           |   |   |         |                 | 312/265.6 |
| 7,784,889 | B2|   | 8/2010  | Benner et al.   |           |
| 8,217,263 | B2|   | 7/2012  | Roth            |           |
| 9,455,554 | B2|   | 9/2016  | Benner          |           |

(Continued)

FOREIGN PATENT DOCUMENTS

| CN | 201418224 Y | 3/2010 |
|----|-------------|--------|
| CN | 104319638 A | 1/2015 |

(Continued)

OTHER PUBLICATIONS

One Monroe (https://monroeengineering.com/blog/the-3-primary-types-of-threaded-fasteners/), published Mar. 13, 2019 (Year: 2019).*

*Primary Examiner* — Brian D Keller
*Assistant Examiner* — Robert C Moore
(74) *Attorney, Agent, or Firm* — Quarles & Brady LLP

(57) ABSTRACT

A glider tool can be provided for installing a back panel of an enclosure. The glider tool can include a body having a first surface, a second surface opposite the first surface, a first end, and a second end opposite the first end, the body defining a length that extends from the first end to the second end. The first end of the body can be configured to engage a front frame member of the enclosure, and the second end of the body can be configured to contact the enclosure, when the glider tool is in an installed configuration.

17 Claims, 17 Drawing Sheets

(56) References Cited

U.S. PATENT DOCUMENTS

| | | | |
|---|---|---|---|
| 10,512,190 B2 | 12/2019 | Anderson et al. | |
| 2005/0082814 A1* | 4/2005 | Ramsey ............... | B62D 53/068 |
| | | | 280/793 |
| 2012/0241393 A1 | 9/2012 | Roth et al. | |
| 2013/0221813 A1 | 8/2013 | Maisch | |
| 2017/0127555 A1 | 5/2017 | Anderson et al. | |

FOREIGN PATENT DOCUMENTS

| | | |
|---|---|---|
| CN | 104319652 A | 1/2015 |
| CN | 106129836 A | 11/2016 |
| CN | 208986380 U | 6/2019 |
| DE | 4312487 A1 | 10/1994 |
| DE | 29509556 U1 | 8/1995 |
| DE | 19647822 C1 | 1/1998 |
| DE | 19737673 A1 | 3/1999 |
| GB | 1273487 A | 5/1972 |
| JP | 2013240198 A | 11/2013 |

\* cited by examiner

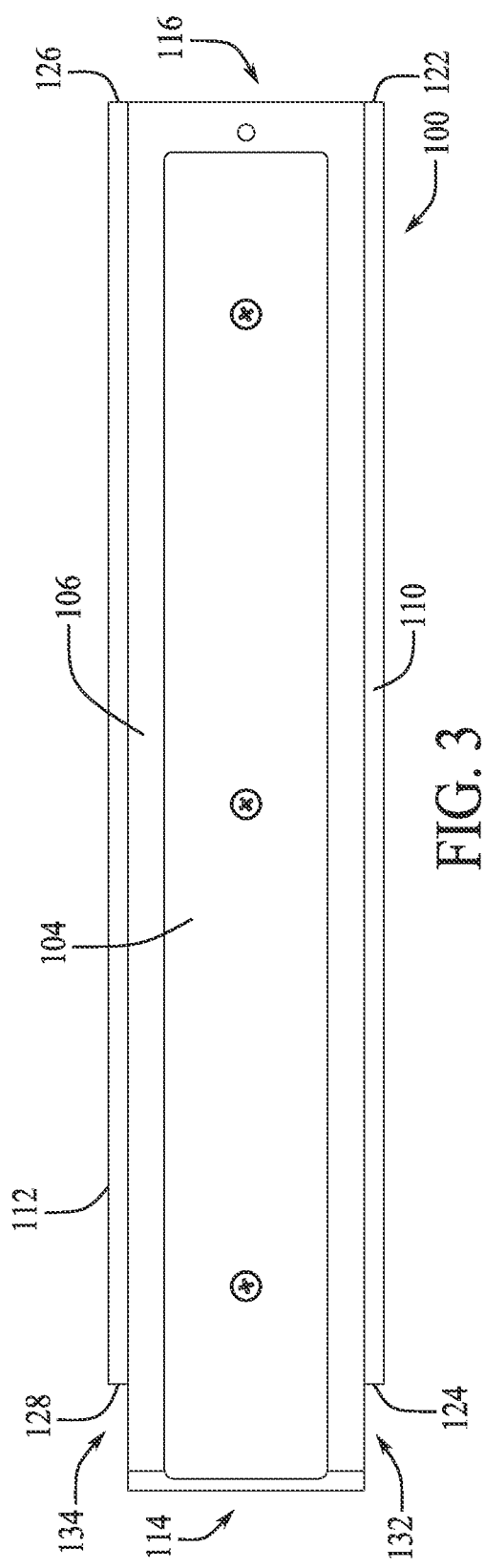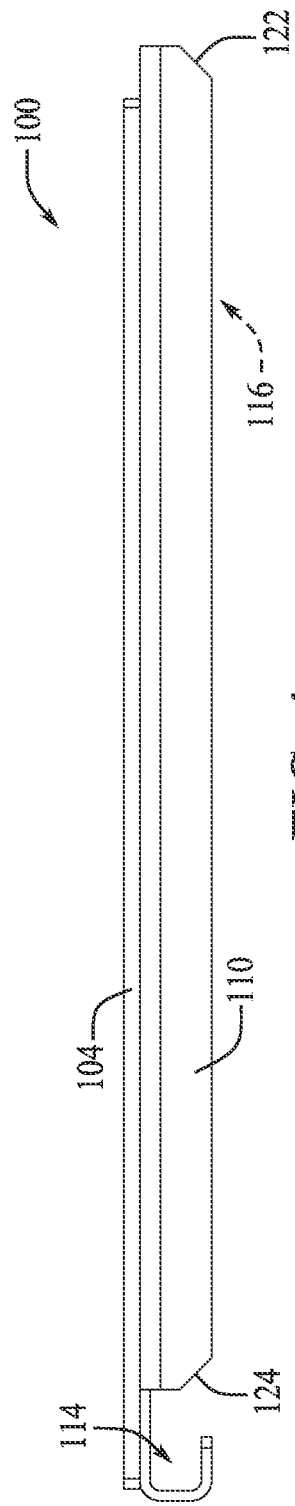
FIG. 3
FIG. 4

SYSTEMS AND METHODS FOR INSTALLING A PANEL OF AN ENCLOSURE

BACKGROUND

Enclosures are used in various industries to conceal and retain different types of components, which can include, for example, electrical components. Typically, enclosures include a metal frame that supports side walls, which define the internal volume of the enclosure. Panels, such as metal back panels, can be secured within the internal volumes of enclosures to support electrical (and other) components.

SUMMARY

Some embodiments of the invention provide a glider tool for installing a back panel of an enclosure.

In some embodiments, a body of a glider tool can have a first surface, a second surface opposite the first surface, a first end, and a second end opposite the first end, the body defining a length that extends from the first end to the second end. The first end of the body can be configured to engage a front frame member of the enclosure, and the second end of the body can be configured to contact the enclosure, when the glider tool is in an installed configuration, so that a gap is located between the second end of the body and a back wall of the enclosure, the gap being larger than the thickness of the back panel of the enclosure.

In some embodiments, a body of a glider tool can have a top surface and a bottom surface. A sliding layer can be positioned on top of and extending along the top surface of the body. The sliding layer can be at least one of: a liquid layer; or a solid layer that is separate from the body of the glider tool. The sliding layer can have a lower sliding coefficient of friction than the sliding coefficient of friction of the top surface of the body. The sliding layer can be configured to slidably support the back panel, for the back panel to be slid along the body from a front opening of the enclosure to a bracket coupled to a back wall of the enclosure.

In some embodiments, a body of a glider tool can have a first surface, a second surface opposite the first surface, a first end, and a second end opposite the first end, the body defining a length that extends from the first end to the second end. The first end of the body can be configured to be removably coupled to a frame member of the enclosure without the use of threaded fasteners, when the glider tool is in an installed configuration, the frame member defining an opening of the enclosure at a front side of the enclosure. The second end of the body can be configured to be removably coupled to a bracket without the use of a threaded fasteners, when the glider tool is in an installed configuration, the bracket being coupled to a back wall of the enclosure.

Some embodiments of the invention provide a method of installing a back panel of an enclosure. A glider tool can be installed to extend between a front opening and a rear bracket of the enclosure, with a sliding layer of the glider tool facing upward, a hook of the glider tool engaged with the enclosure at the front opening, and an end of the glider tool opposite the hook supported on the rear bracket. The back panel can be slid along the sliding layer until the back panel is supported on the rear bracket and not on the glider tool. After the back panel is supported on the rear bracket, the glider tool can be removed from the enclosure.

BRIEF DESCRIPTION OF THE DRAWINGS

The accompanying drawings, which are incorporated in and form a part of this specification, illustrate embodiments of the invention and, together with the description, serve to explain the principles of embodiments of the invention.

FIG. 3 shows a top view of the glider tool of FIG. 1.

FIG. 4 shows a side view of the glider tool of FIG. 1.

DETAILED DESCRIPTION

Figure 1:
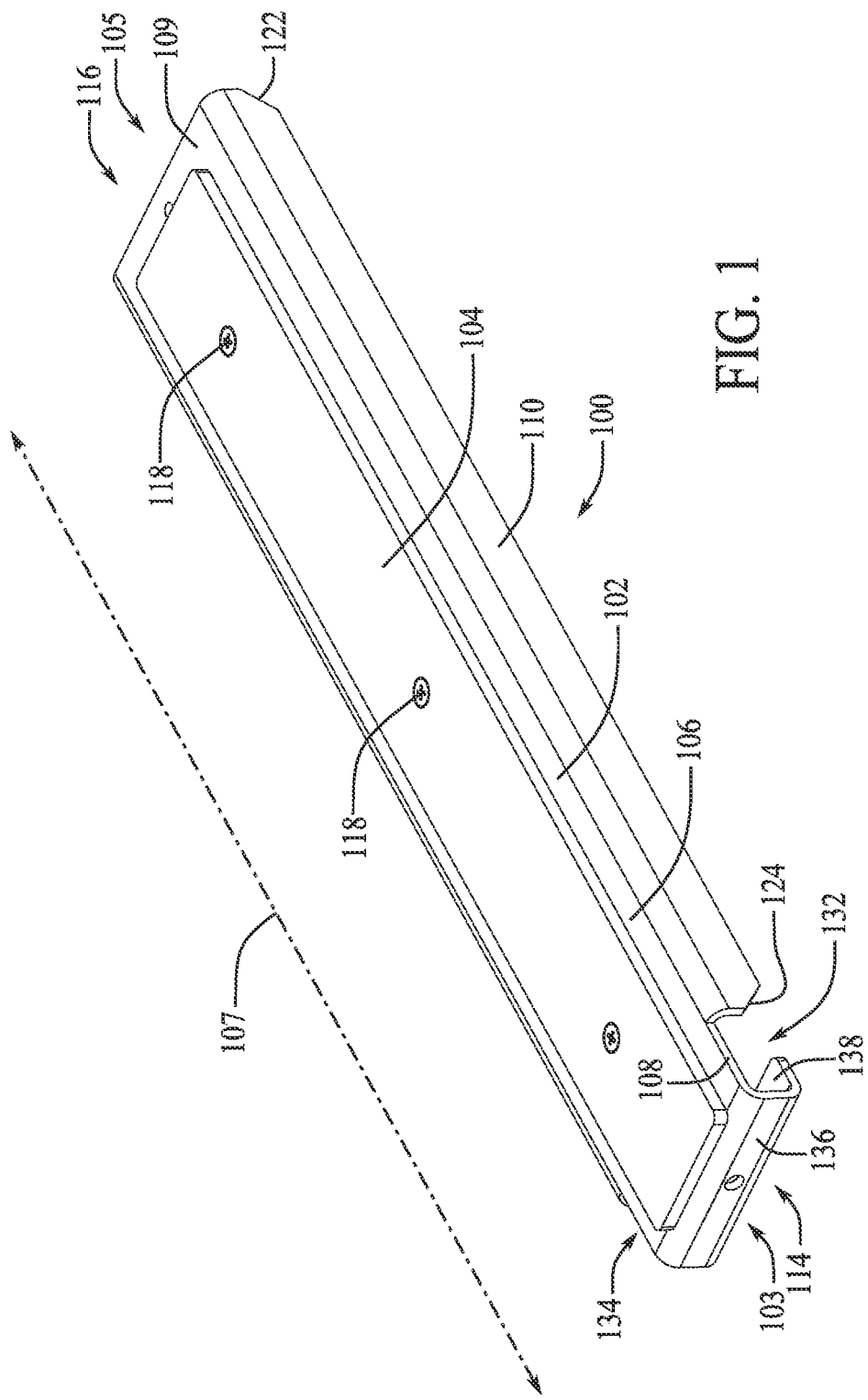
FIG. 1 shows a front isometric view of a glider tool.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

As used herein, unless otherwise limited or defined, discussion of particular directions is provided by example only, with regard to particular embodiments or relevant illustrations. For example, discussion of "top," "front," or "back" features is generally intended as a description only of the orientation of such features relative to a reference frame of a particular example or illustration. Correspondingly, for example, a "top" feature may sometimes be disposed below a "bottom" feature (and so on), in some arrangements or embodiments. Further, references to particular rotational or other movements (e.g., counterclockwise rotation) is generally intended as a description only of movement relative to a reference frame of a particular example of illustration.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

As described above, enclosures can conceal and retain electrical components. These electrical components are typically mounted to a back panel that is positioned frontwards relative to the back wall of the enclosure (e.g., rather than being mounted directly to the back wall of the enclosure). In this way, the electrical components are electrically isolated by an air gap, from the back wall of the enclosure and fasteners to secure the components do not need to extend through the back wall to the outside of the enclosure.

Back panels are often heavy, particularly when installed with components already attached, and can be difficult to maneuver (e.g., orient). During installation, the back panel must be maneuvered through the opening of the enclosure (e.g., defined by a frame that is closed by doors of the enclosure), positioned on a set of brackets that are affixed to the back wall of the enclosure, and aligned with fasteners mounted to the back wall of the enclosure. This process can be difficult, especially considering that some back panels can be large, bulky, and difficult to maneuver. For example, maneuvering the back panel of the enclosure can be particularly difficult considering the tight spaces of the enclosure's internal volume (e.g., the enclosure is typically pre-assembled, and thus the enclosure has all of the enclosure walls). The process is made even more difficult when considering the alignment of the fasteners with the mounting openings in the back panel. For example, even when the back panel is positioned and rested on the brackets, in some cases, the back panel must be reoriented (e.g., shifted laterally), such that the mounting openings of the back panel align with the fasteners.

The installation process of the back panel can be made even more difficult when electrical components are mounted to the back panel, which can make the back panel much heavier and more difficult to orient (e.g., due to the different moments of inertia due to the mounting locations of the electrical components). Although the back panel can be mounted to the enclosure prior to the mounting of the electrical components, electrical components are typically mounted to the back panel prior to being mounted to the enclosure, at least because it can be difficult to mount electrical components within the tight confines of the enclosure. The increased weight, and increased difficulty in orienting the back panel with mounted electrical components makes the installation process more difficult and time consuming.

Some embodiments of the disclosure provide improved systems and methods for installing a back panel of an enclosure, including as may address one or more of the issues noted above. For example, some embodiments of the disclosure provide a glider tool that provides a surface for supporting and allowing for sliding of the back panel, until the back panel reaches the brackets. The glider tool can engage a peripheral flange of the enclosure, and can rest on a respective bracket affixed to the back wall of the enclosure. This engagement of the glider tool can provide a substantially sturdy surface for sliding of the back panel. Thus, the glider tool allows for easy sliding of the back panel thereby preventing the need for cumbersome lifting and maneuvering of the back panel within the tight confines of the enclosure. Additionally, with the appropriate sliding surface, the back panel can be assembled (e.g., slid) with electrical components already attached (e.g., thus making the installation process easier).

Some embodiments of the disclosure provide additional glider tools that allow for increased support, and better sliding of the back panel. For example, typical enclosures have multiple brackets affixed to the back wall of the enclosure, and thus multiple glider tools can be deployed to respective brackets. The brackets are located near respective ends of the back panel, when the back panel is installed, and thus glider tools that are configured to interface with respective brackets allow for additional support and sliding locations for the back panel. In other words, one location of the back panel can be supported and can slide along a first glider tool, and another location of the back panel can be supported and can slide along the second glider tool. This configuration can be advantageous in that multiple glider tools can distribute the weight of the back panel, which can both increase the weight of the back panel that can be supported by the glider tools (e.g., as compared to a single glider tool), and provide easier sliding at the multiple sliding locations (e.g., because the distributed weight decreases the normal force, and thus allows for easier sliding at a sliding location).

FIGS. 1-4 show various views of a glider tool 100 according to one embodiment of the invention. The glider tool 100 includes a body 102, and a sliding layer 104 coupled to the body 102. The body 102 has a first surface 106 (e.g., an upper surface), a second surface 108 (e.g., a lower surface) opposite the first surface 106, flanges 110, 112, a hook 114, and an engagement feature 116. The body 102 can also define a first end 103, and a second end 105 opposite the first end 103. In some cases, the body 102 can have a length that is defined between the ends 103, 105, and which extends along an axis parallel to a longitudinal axis 107.

In some embodiments, the sliding layer 104 can be positioned on top of the first surface 106, and can extend along the first surface 106. The sliding layer 104 can have an upper surface that has a lower sliding coefficient of friction than the sliding coefficient of friction of the surface 106 of the body 102. In this way, objects (e.g., a back panel) positioned on the sliding layer 104 can be slid more easily than objects slid along the first surface 106. The sliding layer 104 can be implemented in different ways. For example, the sliding layer 104 can be a liquid layer (e.g., a hydrophilic liquid layer, an oil layer, etc.) that can be sprayed on the first surface 106 to define the sliding layer 104. As another example, the sliding layer 104 can be a solid layer that can be deposited (and correspondingly adhered after drying)

onto the first surface 106 of the body 102. For example, a hydrophobic coating spray can be deposited (and correspondingly adhered after drying) onto the first surface 106 of the body 102. As yet another example, the sliding layer 104 can be a solid layer defining a support body that is separate from the body 102 of the glider tool 100. In other words, the support body can be structurally distinct from the body 102 (e.g., the glider body). For example, in this case, the sliding layer 104 can be coupled to the first surface 106 (e.g., an upper surface) of the body 102 in different ways. For example, the sliding layer 104 that is a solid layer can be coupled to the first surface 106 of the body 102 using a fastener (e.g., an adhesive, a threaded fastener such as a screw, a mechanical coupling, etc.). As a more specific example, fasteners 118 (e.g., threaded fasteners, such as screws) can engage with respective holes 120 directed through the first surface 106 of the body 102 to couple the sliding layer 104 to the first surface 106 of the body 102.

Although the sliding layer 104 is illustrated as being coupled to the first surface 106 with fasteners, other mechanical couplings could be utilized (e.g., an adhesive, welding, etc.). Additionally, in some embodiments the sliding layer 104 can be removably coupled (e.g., magnetically coupled, with hook and loop fasteners, etc.) to the first surface 106 of the body 102. In this way, as will be described in more detail below, differing sliding layers with differing sliding coefficients of frictions can be easily swapped for a particular installment job. In some embodiments, the sliding layer 104 can extend along the entire length of the body 102 (e.g., between the ends 103, 105), however, in alternative configurations, such as the illustrated embodiment, the sliding layer 104 only extends partially along the length of the body 102. For example, the sliding layer 104 extends from the first end 103 of the body 102, along the body 102, and stops short of the second end 105. Thus, the sliding layer 104 can define an exposed portion 109 of the first surface 106 that is positioned adjacent the second end 105 of the body 102.

As shown in FIG. 1, the flanges 110, 112 extend from and along opposing longitudinal sides of the body 102. For example, the body 102 can define a first longitudinal side that is parallel with the longitudinal axis 107, and a second longitudinal side that is also parallel with the longitudinal axis 107. The flange 110 extends from the first longitudinal side in a direction away from the first surface 106 of the body 102, while the flange 112 extends from the first longitudinal side in the same direction away from the first surface 106 of the body 102. In some cases, the flange 110 can have chamfered ends 122, 124 that are angled toward a central region of the body 102 (e.g., a central region relative to an axis that is parallel to the longitudinal axis 107, a central region between the ends 103, 105 of the body 102, etc.), such that an upper portion of a chamfered end is located farther away from a lower portion of the chamfered end relative to the central region of the body 102. Similarly, the flange 112 (see, e.g., FIGS. 4 and 5) also has chamfered ends 126, 128 that are also angled towards the central region of the body 102 (e.g., a central region relative to an axis that is parallel to the longitudinal axis 107, a central region between the ends 103, 105 of the body 102, etc.), such that an upper portion of a chamfered end is located farther away from a lower portion of the chamfered end relative to the central region of the body 102.

In the illustrated embodiment, both flanges 110, 112 do not extend along the entire longitudinal side of the body 102. Rather, as shown in FIGS. 1 and 3 in particular, the flange 110 extends from the second end 105 along the body 102, but stops short of the first end 103 of the body 102. Similarly, the flange 112 extends from the second end 105 along the body 102, but also stops short of the first surface 103 of the body 102. Thus, a gap 132 is located between the end 124 of the flange 110 and the first end 103 (e.g., that includes the hook 114), and a gap 134 is located between the flange 112 and the first end 103. The gaps 132, 134 allow the hook 114 to have a clearance for easier engagement with (and disengagement from) a frame member (e.g., a peripheral flange) of the enclosure. In some embodiments, and as discussed in more detail below, the flanges 110, 112 can extend along part of opposing sides of a corresponding rear bracket of the enclosure (e.g., the bracket being situated between the flanges 110, 112), thereby preventing unwanted translation of the glider tool 100 along the frame member (e.g., the peripheral flange) of the enclosure. In alternative configurations, however, each flange 110, 112 can extend along the entire length of the body 102.

Figure 2:
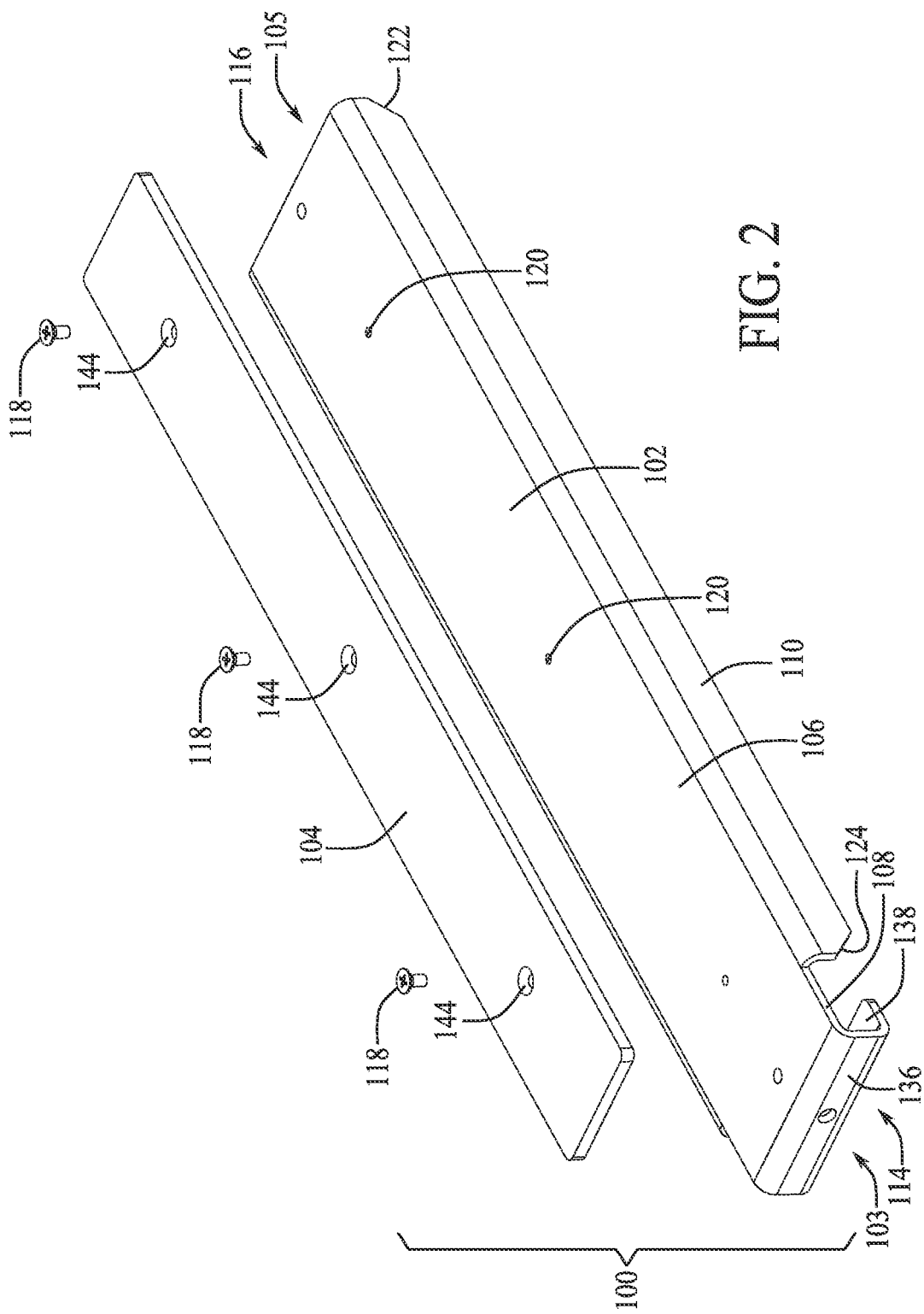
FIG. 2 shows an exploded view of the glider tool of FIG. 1.
Figure 5:
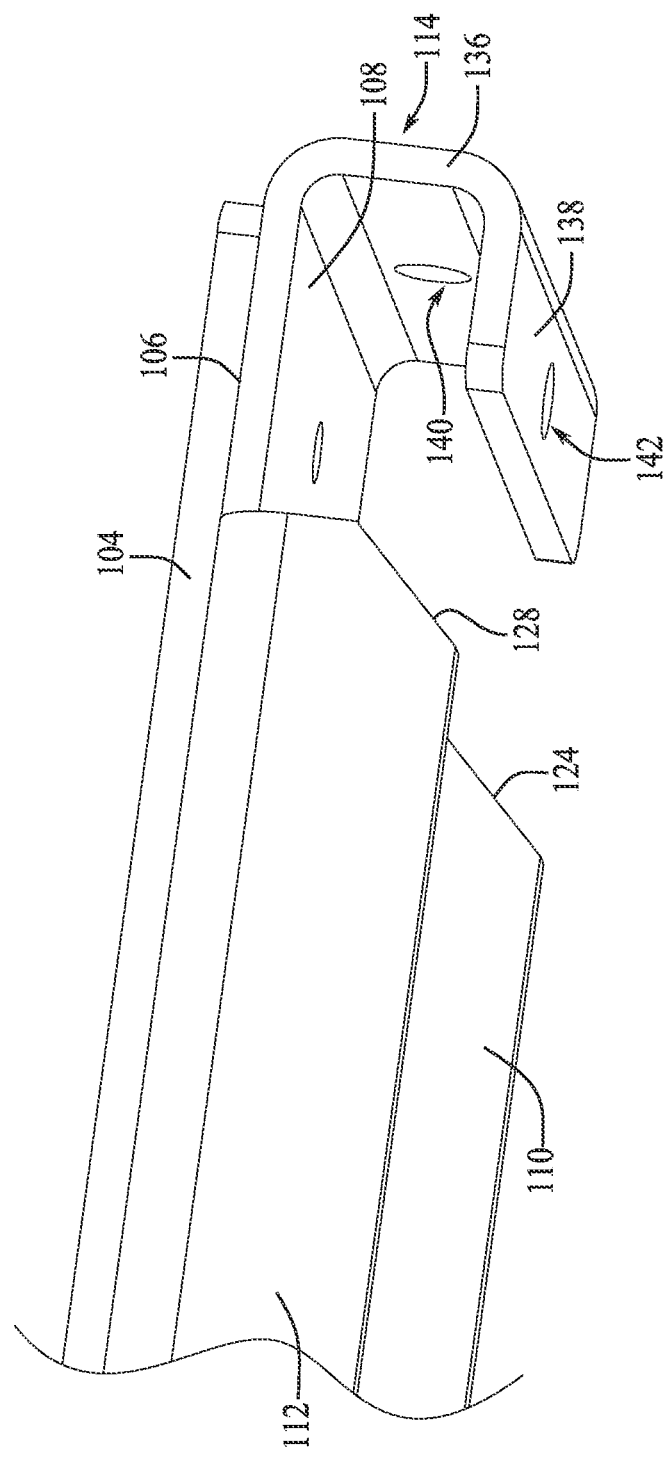
FIG. 5 shows an isometric enlarged view of a hook of the glider tool of FIG. 1.

In some cases, such as in different embodiments, different end configurations are possible, including differently configured hooks. As shown in FIGS. 1, 2, and 5, in particular, the hook 114 has a u-shape and is positioned at the first end 103 of the body 102 (e.g., and end of the body opposite the end of the body 102 with the engagement feature 116). More specifically, the hook 114 includes an arm 136 extending from the end of the body 102, and a ledge 138 extending from the arm 136. The ledge 138 is substantially (e.g., deviating by at most 20°, such as by 5° from) perpendicular to the arm 136, and is substantially (e.g., deviating by at most 20°, such as by 5° from) parallel to the surfaces 106, 108 of the body 102. The hook 114 is configured to engage with a frame member (e.g., a peripheral flange) of the enclosure, and thus the hook 114 including the first end 103 of the body 102 is configured to be removably coupled to the frame member of the enclosure. More specifically, the shape of the arm 136 contours the shape of the peripheral flange, and the ledge 138 of the hook 114 rests under an end of the peripheral flange of the enclosure, when the hook 114 engages the peripheral flange of the enclosure. In other embodiments, other configurations are possible. For example, some hooks may not include a ledge configured similarly to the ledge 138, may include arms or ledges of different relative lengths, or may be otherwise generally configured to engage other types of enclosures at front openings thereof.

Although the glider tool 100 has been described with a hook 114 positioned at the first end 103 of the body 102, other configurations are possible (e.g., different from the hook) that allow the first end 103 of the body 102 to be removably coupled to the frame member of the enclosure. For example, the glider tool 100 can have a clip (e.g., that selectively receives the frame member), a slot (e.g., that receives a protrusion of the frame member), a protrusion (e.g., that is inserted into a hole of the frame member), a recess (e.g., that receives a protrusion of the frame member), a hole e.g., that receives a protrusion of the frame member), a flange (e.g., that extends along the frame member), a pair of flanges (e.g., with the frame member positioned between the flanges), etc. at the first end 103 of the body 102. Regardless of these configuration, in each of these examples the first end 103 of the body 102 is configured to be removably coupled to the frame member without the use of threaded fasteners.

Referring specifically to FIG. 2, the sliding layer 104 includes holes 144 that can be tapped in some embodiments, and are generally directed through the entirety of the sliding layer 104. The sliding layer 104 is coupled to the first surface 106 of the body 102 by the engagement between the fasteners 118 through a respective hole 144 and (partially) into a respective hole 120. Due to the countersunk configuration of the holes 144 in the illustrated embodiment, the entirety of the heads of the fasteners 118 are nested within the respective holes 144. This way, the heads of the fasteners 118 do not contact the sliding surface of the back panel when the back panel slides across the sliding layer 104. The illustrated configuration may be relatively simple to manufacture and assemble, and can allow relatively easy replacement of sliding layers (e.g., upon degradation of the layers, or to allow customization of the layers for particular contexts). However, other approaches are possible to couple a sliding layer to a tool body, including adhesives, non-threaded fasteners, and so on. In some configurations, the sliding layer 104 can be removably coupled to the first surface 106 of the body 102, such as, for example, by magnetic coupling, hook and loop fasteners, etc.

Generally, the sliding layer 104 can have a sliding coefficient of friction that is lower than the sliding coefficient of friction of the first surface 106 of the body 102. This can allow for easier sliding of the back panel across the sliding layer 104, rather than sliding over the first surface 106 of the body 102. The sliding layer 104 can be formed out of various materials, such as, plastics (e.g., ultra-high weight molecular polyethylene) or other polymers, etc. In some embodiments, although the sliding layer 104 is shown as having a substantially large thickness, a sliding layer can be fairly small. For example, some sliding layers can be formed to include a thin coating of materials with low coefficients of friction, such as silicone (e.g., by vapor deposition). In some embodiments, the sliding layer 104 can be omitted, and in this case, the back panel slides across the first surface 106 of the body 102.

In some embodiments, a glider tool can include an engagement feature that is configured to engage with a corresponding feature of the bracket affixed to the back wall of the enclosure to help secure the glider tool in place. Depending on the corresponding feature of the bracket, an engagement feature can embody different forms. For example, in the illustrated embodiment, an engagement feature 116 can be a protrusion (e.g., a pin) extending from the second surface 108 of the body 102 so as to be received in a slot or other opening of the bracket (see, e.g., FIG. 10). Alternatively, an engagement feature can be a slot (or recess) directed into the second surface 108 of the body to receive a protrusion (e.g., a pin) of the bracket. In some embodiments, and as illustrated in FIG. 2, the engagement feature 116 is positioned adjacent to the second end 105 of the body and is located on the exposed portion 109 of the first surface 106.

In some embodiments, the engagement between the engagement feature 116 with the corresponding feature of the bracket decreases (or prevents) longitudinal translation (e.g., the direction from the hook 114 to the engagement feature 116, or along the longitudinal dimension of the body 102) of the glider tool 100. This can be useful, for example, to prevent inadvertent longitudinal removal of the body 102 from the bracket. In some embodiments, the engagement feature 116 can help to prevent lateral translation of the body 102 relative to the bracket, with similarly beneficial effects relative to inadvertent lateral movement of the body 102. In some embodiments, an engagement feature can be omitted.

In some embodiments, and as also described below, the second end 105 of the body 102 can be removably coupled (e.g., without the use of threaded fasteners) to a portion of the enclosure (e.g., a bracket coupled to a rear wall of the enclosure, the rear wall of the enclosure, etc.). For example, the flanges 110, 112 can extend along the bracket (e.g., the bracket being positioned between the flanges 110, 112) and thereby prevent lateral translation of the glider tool 100. Further, because the majority of longitudinal forces on a glider tool may tend to be towards the rear wall of the enclosure, the resistance to rearward longitudinal movement provided by a front hooked end of a glider tool may be generally more useful than resistance to forward longitudinal movement as provided by a hook or other features. In some embodiments, while the second end 105 of the body 102 can be removably coupled, without the use of fasteners, to a portion of the enclosure (e.g., the bracket coupled to a rear wall of the enclosure) by using the flanges 110, 112, the second end 105 of the body 102 can have other features that provide the removably coupled configuration without the use of fasteners (e.g., such as those described with reference to the first end 103 of the body 102).

Figure 9:
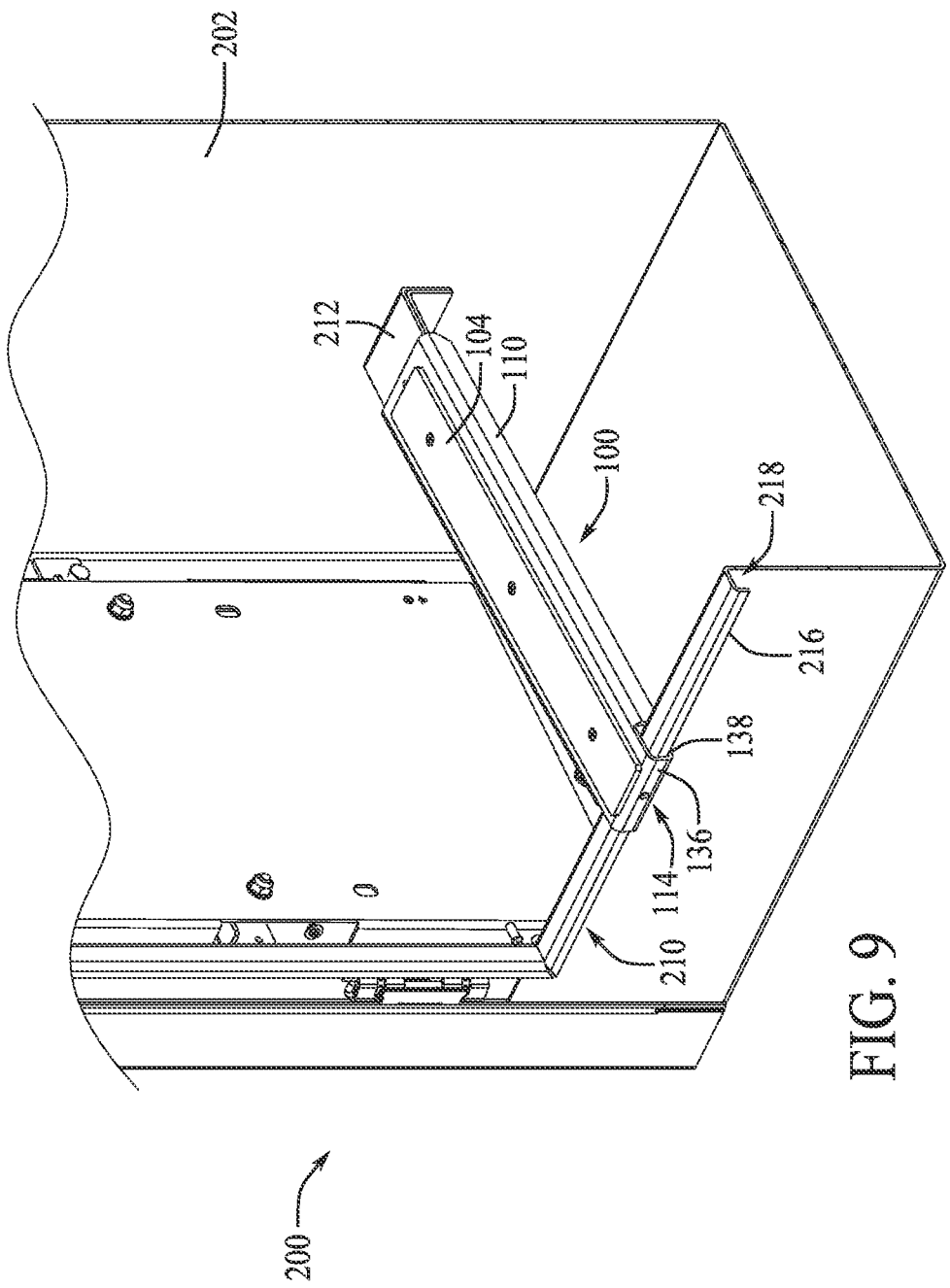
FIG. 9 shows a cross-sectional view of the enclosure of FIG. 8 taken along line 9-9 of FIG. 8.

FIG. 5 shows an enlarged perspective view of the hook 114 of the glider tool 100. As also described below, the peripheral flange of the enclosure nests within the hook 114, which can decrease (e.g., prevent) longitudinal translation of the glider tool 100, while allowing translation of the glider tool 100 along the peripheral edge of the enclosure. For example, when the hook 114 engages with the peripheral flange of the enclosure and the flanges 110, 112, as shown in FIG. 9, and an engagement feature is not engaged with the bracket, the glider tool 100 can be translated along the peripheral flange of the enclosure. This can be advantageous in that any peripheral flange location can be used to interface with the hook 114, and the glider tool 100 can then be slid (or otherwise translated) accordingly to the desired location.

As shown in FIG. 5, the arm 136 of the hook 114 includes an aperture 140 directed therethrough, and the ledge 138 of the hook 114 also includes an aperture 142 directed therethrough. Both apertures 140, 142 are illustrated as being circular, however in alternative configurations the apertures 140, 142 can embody different shapes (e.g., rectangular, square, octagonal, hexagonal, etc.). The apertures 140, 142 allow for easy and secure storage. For example, the apertures 140, 142 can be received by pins (e.g., protrusions, hooks, etc.) mounted on a structure (e.g., a wall), such as a storage structure. Thus, the glider tool 100 can be easily stored at a specific location (e.g., when the glider tool 100 is not in use), helping to ensure that the glider tool 100 is not misplaced or otherwise mismanaged.

Figure 6:
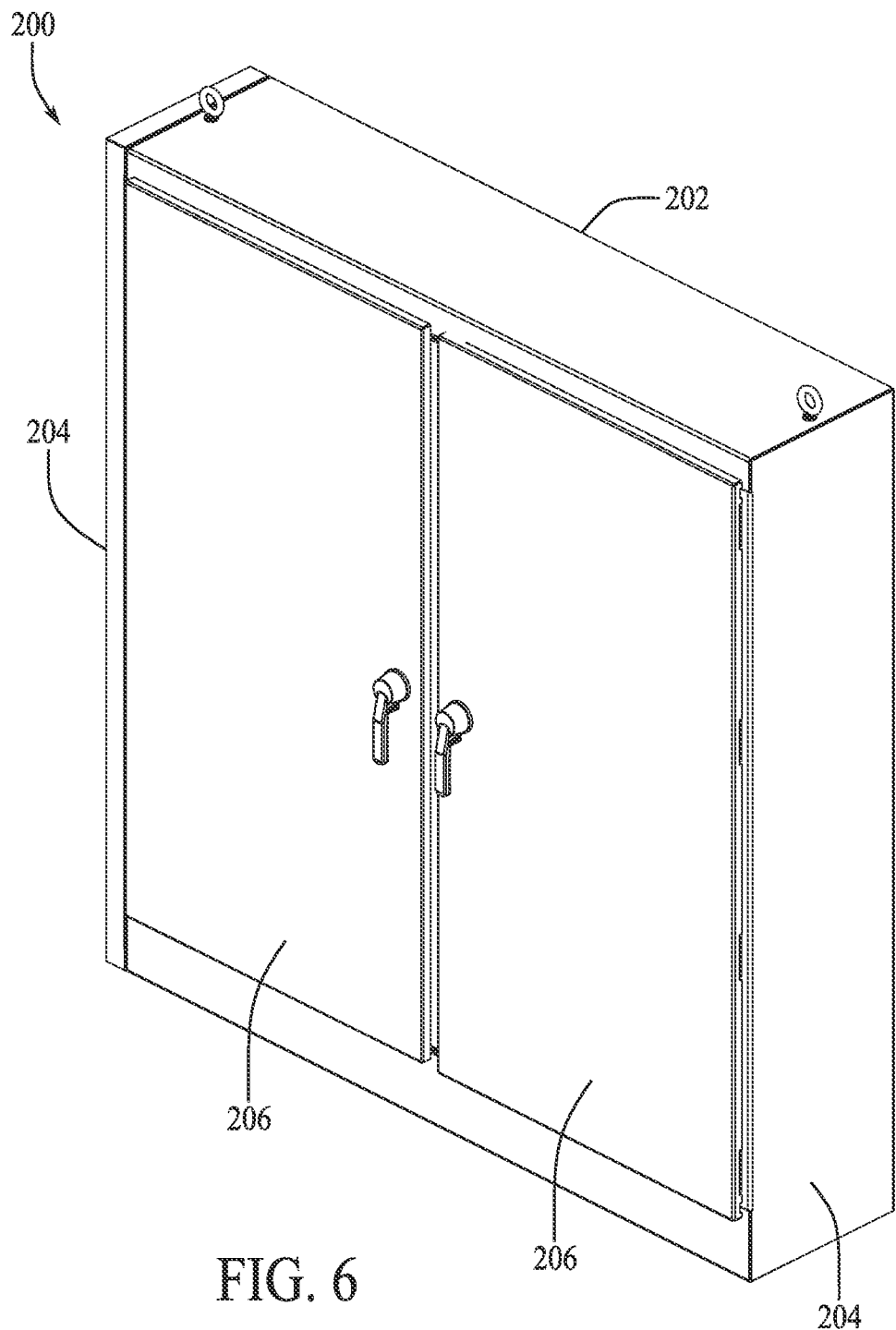
FIG. 6 shows an isometric view of an enclosure.

FIGS. 6-17 show, and the corresponding description describes the usage of glider tools 100 with an enclosure 200. FIG. 6 shows a front perspective view of an enclosure 200. The enclosure 200 includes a back wall 202, side walls 204, and doors 206.

Figure 7:
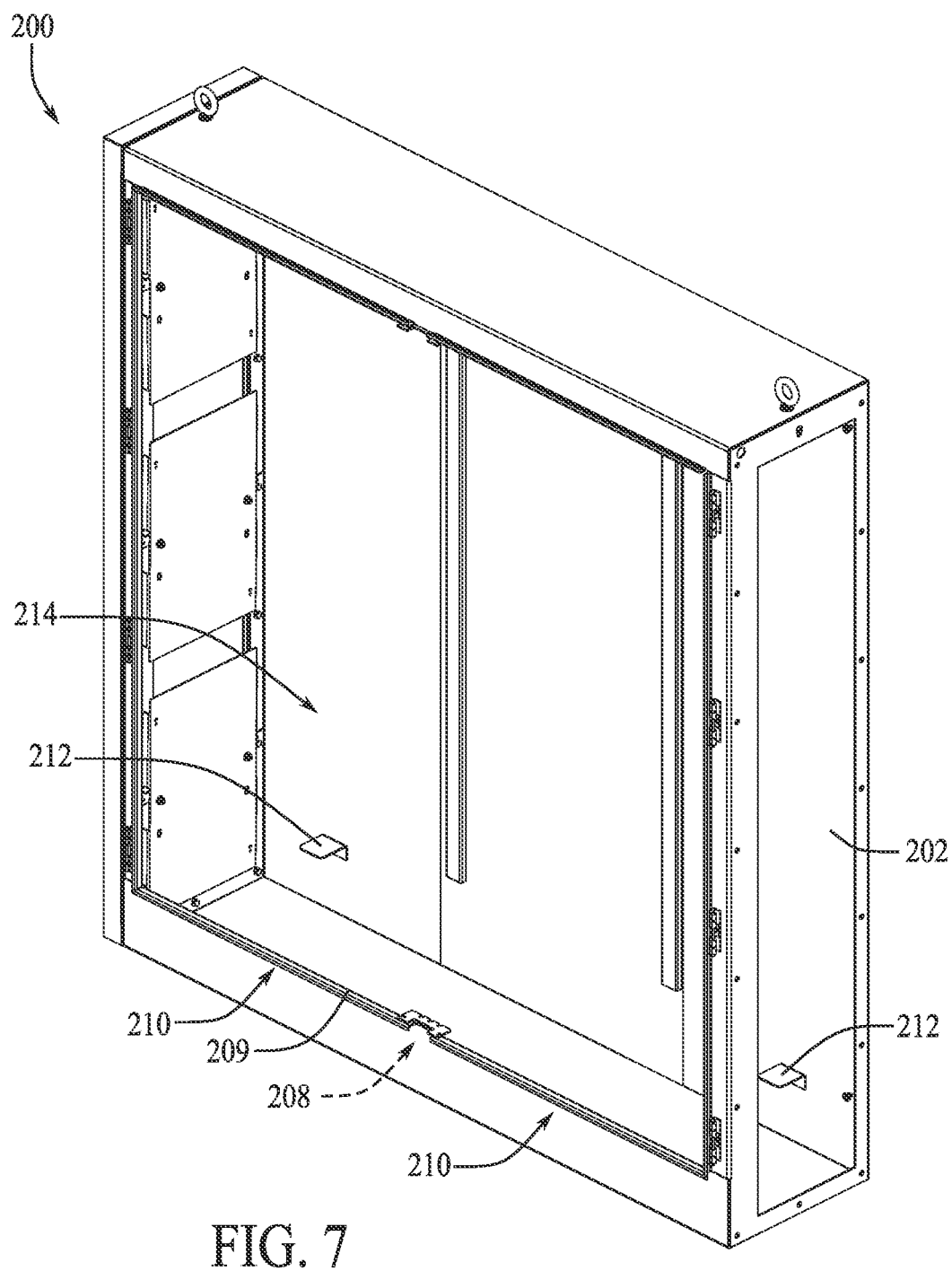
FIG. 7 shows an isometric view of the enclosure of FIG. 6 with the doors, center post, and a side wall removed for visual clarity.

FIG. 7 shows a front perspective view of the enclosure 200 of FIG. 6, with the doors 206 removed, the center post 208 removed, and one of the side walls 204 removed for visual clarity. With the doors 206 removed, a front frame member 209 that can define a peripheral flange 210 of the enclosure 200, and the brackets 212 affixed to the back wall 202 are more clearly visible. As shown in FIG. 7, the front frame member 209 is part of the frame of the enclosure 200 that is located at the front of the enclosure 200. The frame member 209 can define an opening 214 of the enclosure 200 that receives the back panel, and can define a peripheral flange 210 extends along a lower side of the front frame member 209. The enclosure 200 also can include the brackets 212 that can be generally L-shaped and are coupled (e.g., by welding) to the back wall 202 of the enclosure.

Figure 8:
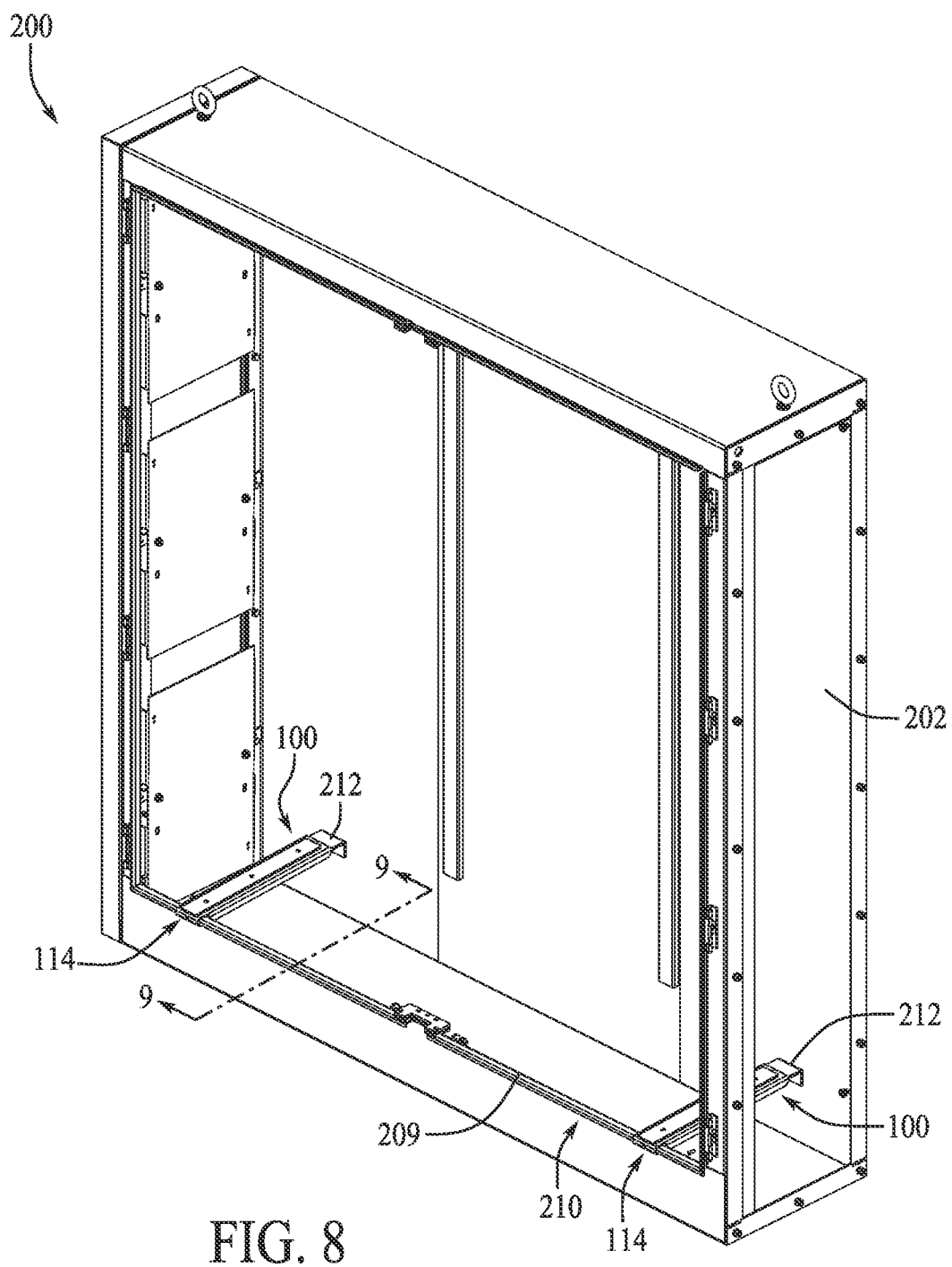
FIG. 8 shows an isometric view of the enclosure of FIG. 7 with glider tools installed.

FIGS. 8 and 9 show instances of the glider tools 100 in respective installed configurations with the enclosure 200. As shown, each glider tool 100 is engaged with one bracket 212 (e.g., a right and a left bracket 212). In particular, each bracket 212 supports a second end of each of the glider tools 100, and the opposing ends of each glider tool 100 (e.g., having the hook 114) being engaged with and in contact with the front frame member 209 of the enclosure 200, and in particular the peripheral flange 210 of the enclosure 200.

In one approach to installation, each glider tool 100 can be positioned by first engaging each hook 114 of each glider tool 100 with a portion of the front frame member 209 (e.g., the peripheral flange 210) of the enclosure 200. For example, a glider tool 100 can be positioned in a substantially perpendicular orientation relative to the view in FIG. 8. In other words, the arm 136 can be substantially perpendicular to an edge of a free end 216 of the peripheral flange 210. Then, with the glider tool 100 in this orientation, the ledge 138 can be inserted into a channel 218 defined by the peripheral flange 210 (e.g., until a portion of the ledge 138 contacts a surface of the peripheral flange 210). The entire glider tool 100 can then be pivoted towards the back wall 202 until the second surface 108 of the glider tool 100 contacts a surface of the peripheral flange 210 thereby providing the engagement between the hook 114 of the glider tool 100 and the peripheral flange 210 (e.g., the ledge 138 being situated underneath the free end 216 of the peripheral flange 210). In some cases, the glider tool 100 has already been previously aligned with the respective bracket 212, however, in other cases, the glider tool 100 when the hook 114 is engaged with the peripheral flange 210 can be translationally moved (e.g., slid) along the peripheral flange 210 until the glider tool 100 is aligned with the respective bracket 212.

Once appropriate engagement between the hooks 114 and the peripheral flange 210 is achieved, the respective glider tool 100 can be engaged with a respective bracket 212. As shown in FIG. 9, the flanges 110, 112 are received along opposing edges of the bracket 212, and the second surface 108 of the glider tool 100 is positioned on an upper surface of the bracket 212, when the glider tool 100 engages with the bracket 212. In other words, in an installed configuration, each second end 105 of each glider tool 100 contacts the bracket 212, with the bracket 212 being positioned between the flanges 110, 112 of the glider tool 100. In some cases, such as when the glider tool 100 is slid along the peripheral flange 210 to align with the bracket 212, the glider tool 100 can be pivoted away from the back wall 202, slid further along the peripheral flange 210 in this orientation, and pivoted back towards the back wall 202 for proper engagement of the flanges 110, 112 of the glider tool 100 with the bracket 212.

In some installations, the hook 114 and the flanges 110, 112 of the glider tool 100 can thus provide certain structural advantages. For example, when the hook 114 is engaged with the peripheral flange 210, substantial translation of the glider tool 100 towards the back wall 202 is generally prevented, and translation of the glider tool 100 away from the back wall 202 is also limited (e.g., when the flanges 110, 112 contact the inner side of the peripheral flange 210). Additionally, because they extend partly along opposing lateral sides of the bracket 212, the flanges 110, 112 can generally prevent lateral translation of the glider tool 100 along the peripheral flange 210 in either direction.

In some embodiments, these structural advantages are particularly helpful when sliding a back panel along the sliding layer 104 of the glider tool 100. For example, for reasons generally discussed above, the hook 114 and the flanges 110, 112 can help to ensure that the glider tool 100 is not inadvertently shifted out of alignment or off of the peripheral flange 210 or the bracket 212 as the back panel is slid longitudinally or laterally along the sliding layer 104 of the glider tool 100.

As another advantage, as shown in FIG. 9, in particular, a relatively large clearance is provided between the glider tool 100 and the rear wall 202 of the enclosure 200 when the hook 114 is engaged with the peripheral flange 210 and the glider tool 100 is seated on the bracket 212. Thus, for example, a rear panel can be readily slid off of the glider tool 100 to be fully supported by the bracket 212, thereby allowing the glider tool 100 to be easily removed without elevated risk of the rear panel slipping downward onto fingers or tools. Further, due to the relatively low vertical profile of the sliding layer 104, any substantial vertical drop of the rear panel from the glider tool 100 onto the bracket 212, such as could risk damage to certain components, can be avoided.

Figure 10:
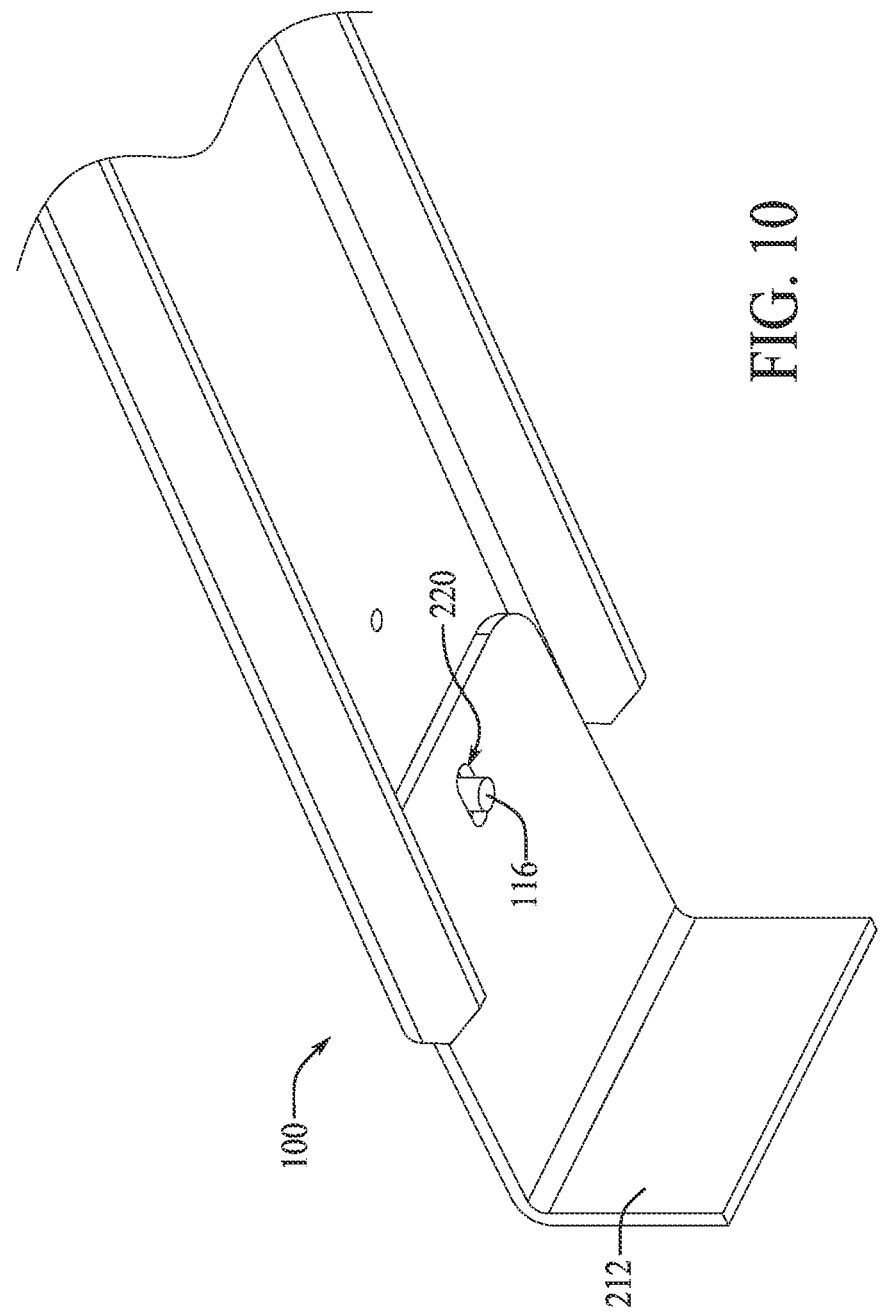
FIG. 10 shows a bottom isometric view of the engagement between an engagement feature of a glider tool with a bracket of an enclosure.

FIG. 10 shows a bottom perspective view of the engagement between the engagement feature 116 of the glider tool 100 with a corresponding feature of the bracket 212. In the illustrated embodiment of FIG. 9, the bracket 212 has a corresponding feature being a slot 220, and the engagement feature 116 of the glider tool 100 is a protrusion (e.g., a pin). The protrusion of the glider tool 100 is inserted into the slot 220 when the glider tool 100 is engaged with the bracket 212, which can further mitigate translation of the glider tool 100 towards (and away) the back wall 202, and mitigate translation of the glider tool 100 along the peripheral flange 210 (in either direction). As also noted above, however, some embodiments may not include a similar engagement feature on a glider tool. For example, some longitudinal and lateral translation of a glider tool can be appropriately limited in some embodiments by flanges (e.g., similar to the flanges 110, 112) and by hooked ends (e.g., similar to the hook 114), or in other ways.

Figure 11:
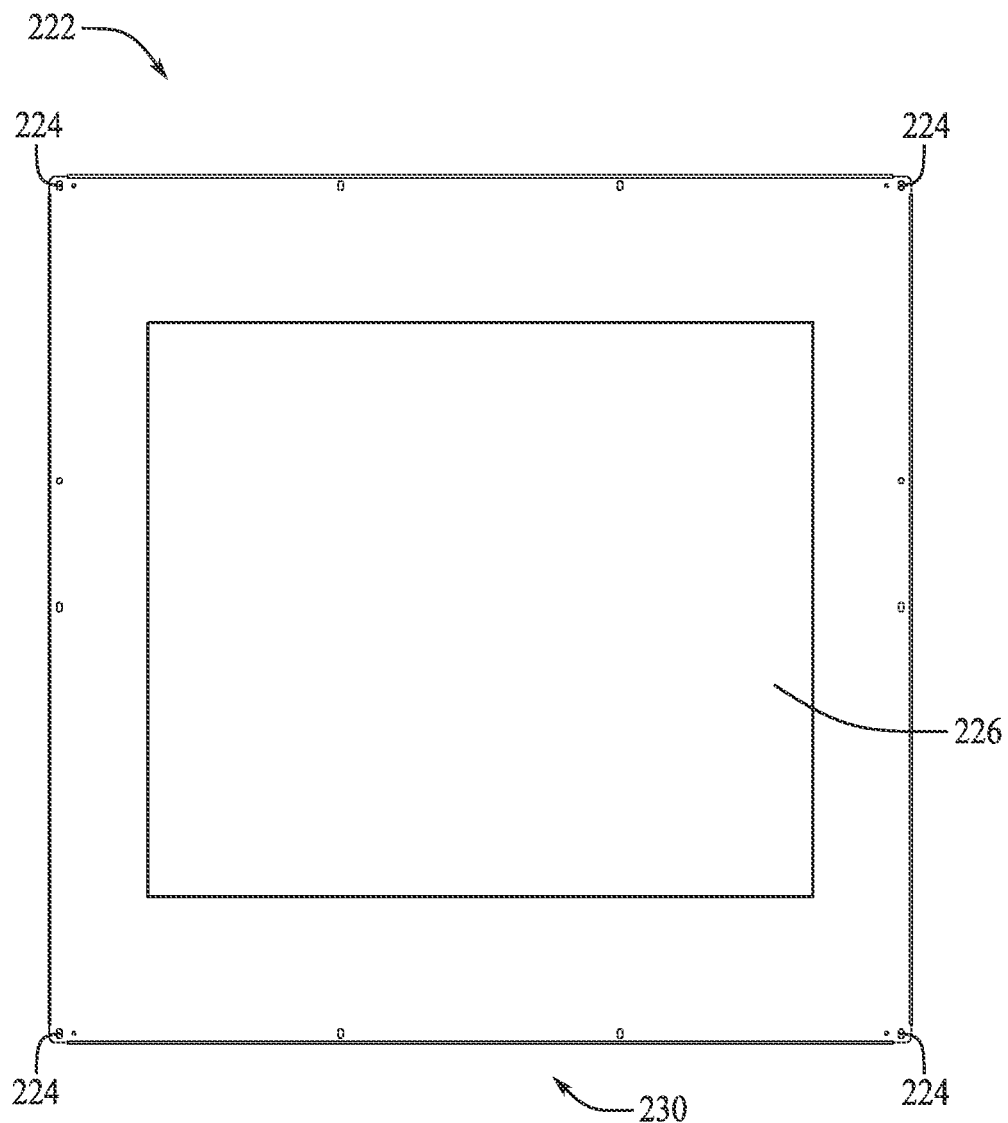
FIG. 11 shows a front elevation view of a back panel for the enclosure of FIG. 6.

FIG. 11 shows a front side view of a back panel 222 for an enclosure 200. The back panel 222 of the enclosure 200 includes a number of holes 224 situated around the periphery of the back panel 222. Additionally, while not required, but generally implemented, the back panel 222 includes electrical components 226 mounted to a side of the back panel 222.

Figure 12:
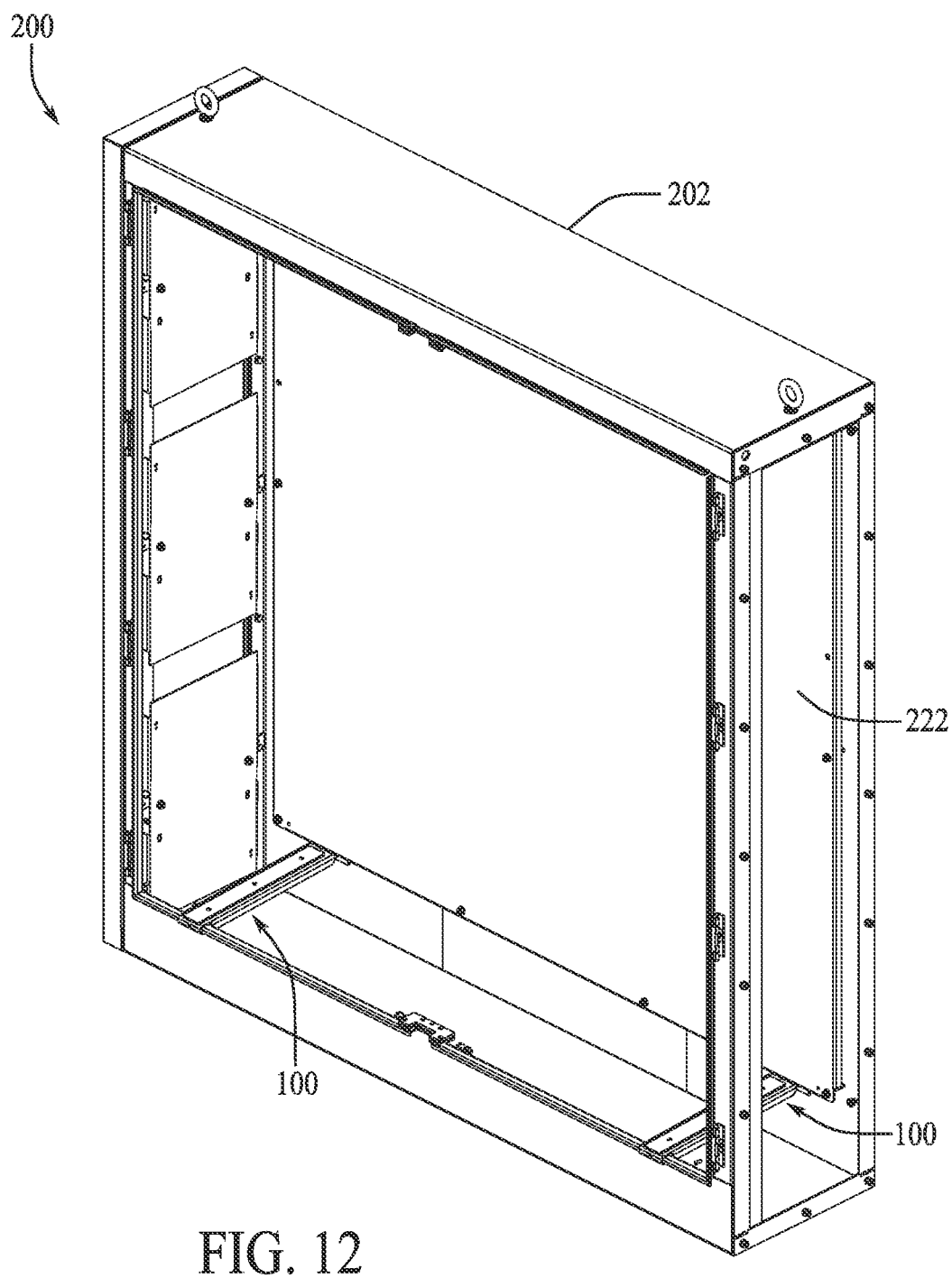
FIG. 12 shows an isometric view of the enclosure of FIG. 8 with the back panel having been slid along the installed glider tools.

FIG. 12 shows a front perspective view of the enclosure 200 of FIG. 8 with the back panel 222 being slid along the glider tools 100. For example, a lower surface 230 of the back panel 222 slides along the sliding layers 104 of the gliding tools 100 until the lower surface 230 slides off of the sliding layer 104, to contact and be fully supported by a respective surface of the brackets 212. In some cases, before the lower surface 230 (e.g., that includes a flange 231 extending away from the panel 222) is slid off of the sliding layer 104 to be directly supported by the brackets 212, the back panel 222 can be slid laterally on the gliding tools 100 (as needed) to align mounting features of the back panel 222 and the enclosure 200 (e.g., to align bolts coupled (e.g., via welding) to the back wall 202 of the enclosure 200 with respective holes 224 of the back panel 222). This can allow for a substantially easy installation as the back panel 222 can be easily moved on the sliding layers 104 into appropriately lateral alignment, and then the tactile feedback of the back panel 222 being slid off of the sliding layer 104 can provide an indication to the installers that the back panel 222 is in the appropriate position. Additionally, the simultaneous alignment (or insertion) of the bolts into the respective holes 224 of the back panel 222 prevents the need for cumbersome reorientation of the back panel 222.

Figure 13:
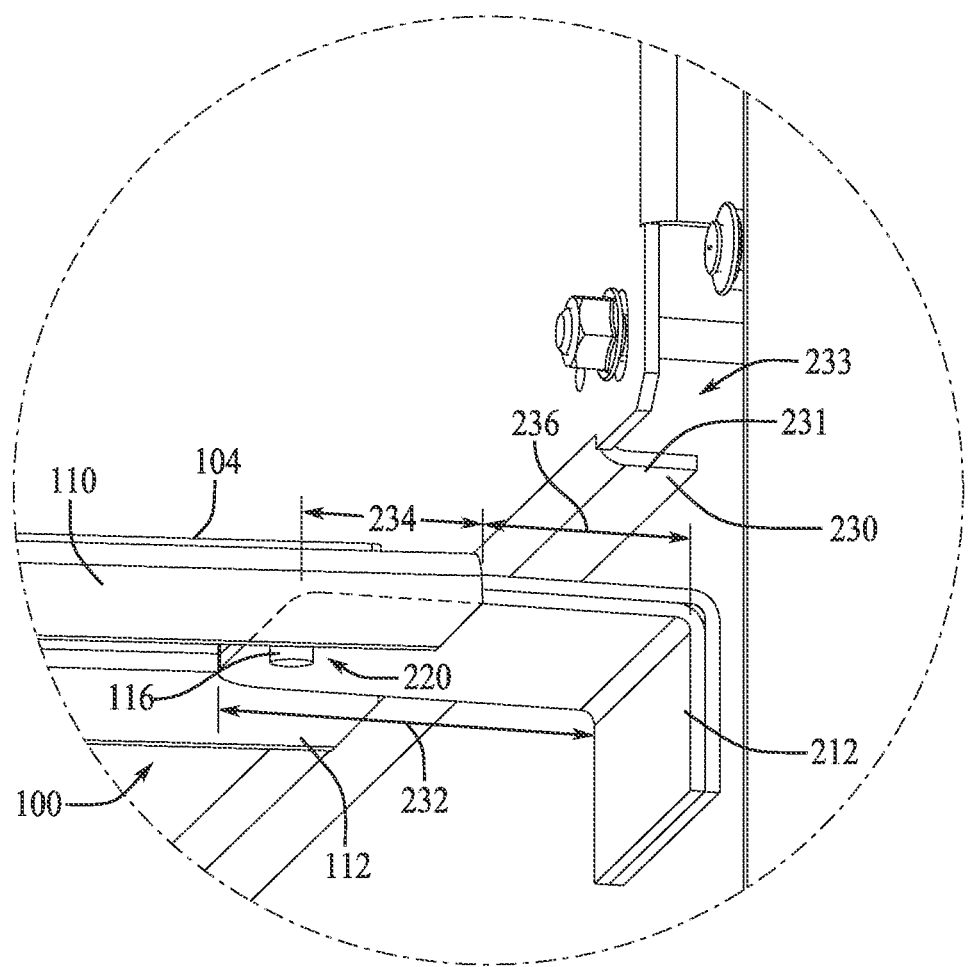
FIG. 13 shows an isometric enlarged side view of the glider tool engaged with a bracket of the enclosure of FIG. 12.

FIG. 13 shows a zoomed in perspective view of the glider tool 100 engaged with the bracket 212 and the back panel 222 having been slid off of the sliding layer 104 of the gliding tool 100. As shown, the bracket 212 extends away from the back wall 202 in a substantially perpendicular direction for a longitudinal distance 232. Additionally, when the glider tool 100 is engaged with the front fame member 209 (e.g., the peripheral flange 210) and the bracket 212, the flanges 110, 112 of the glider tool 100 overlap vertically with and extend along opposing sides of the bracket 212 for a longitudinal distance 234, which is illustrated as being smaller than the longitudinal distance 232. In other words, when in an installed configuration, each second end of each glider tool 100 does not contact the back wall 202 of the enclosure 200. Thus, a gap 233 is defined between the back wall 202 of the enclosure 200 and a second end 105 of the glider tool 100 for each glider tool 100. The gap 233 can be larger than the thickness (e.g., including the extension of the flange 231 away from the panel 222. In this way, the gap 233 provides a clearance relative to the back wall 202 of the enclosure 200 to permit the back panel 222 to seat on the bracket 212 between the body 102 (e.g., the second end 105 of the body 102) and the back wall 202. In alternative configurations, each second end 105 of each glider tool 100 when in an installed configuration can contact the back wall 202 of the enclosure 200.

As shown in FIG. 13, the gap 233 can define a longitudinal distance 236 (e.g., which can be a subtraction between the longitudinal distance 232 and the longitudinal distance 234) that receives the lower surface 230 of the back panel 222. The longitudinal distances 232, 234 are dimensioned such that when the back panel 222 clears (slides off) the sliding layer 104 (and the body 102 of the glider 100), the lower surface 230 of the back panel 222 can contact the surface of the bracket 212 at a location within the longitudinal distance 236, and the bolts (also described below) coupled to the back wall 202 are aligned with (or otherwise inserted into) the respective holes 224 of the back panel 222.

Figure 14:
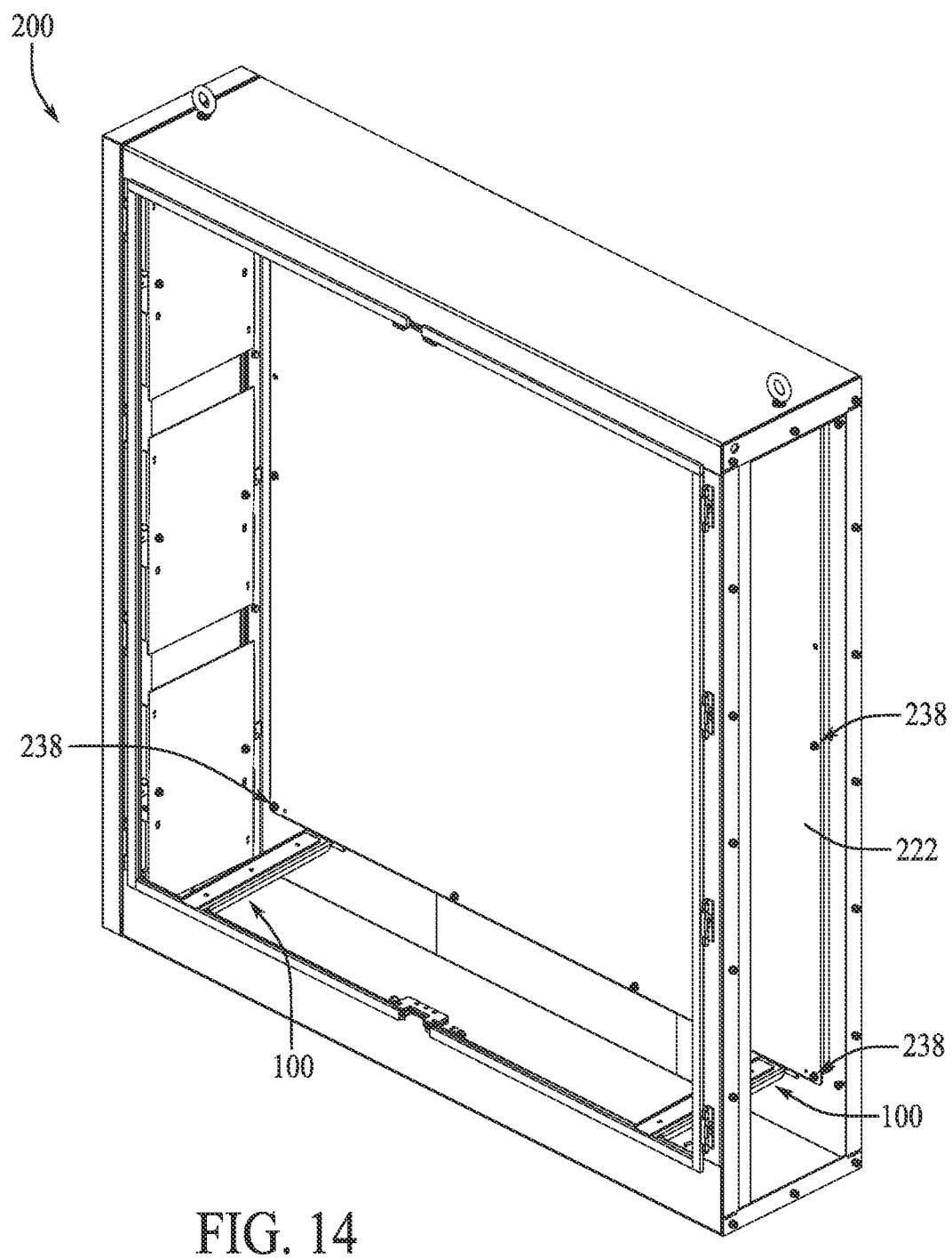
FIG. 14 shows an isometric view of the enclosure of FIG. 12 after fastening assemblies have been installed.
Figure 15:
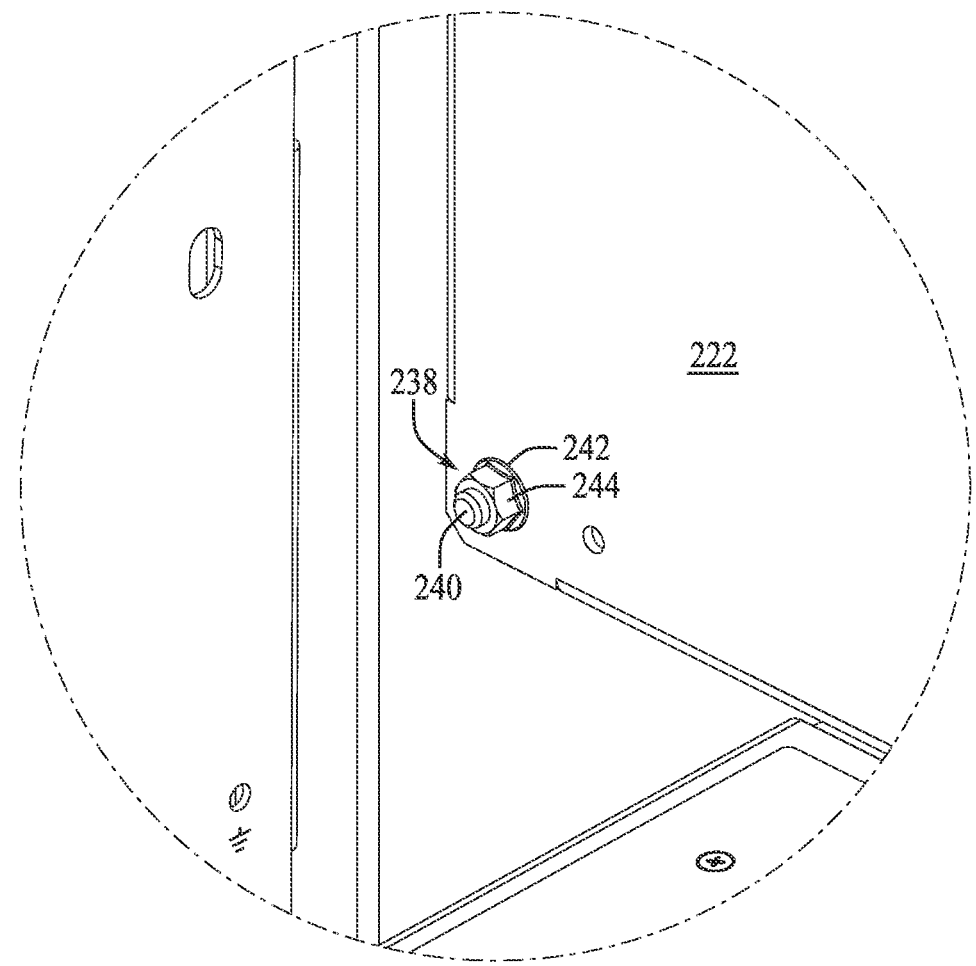
FIG. 15 shows an isometric enlarged view of one of the fastening assemblies in an installed configuration engaged with and secured to the back panel.
Figure 16:
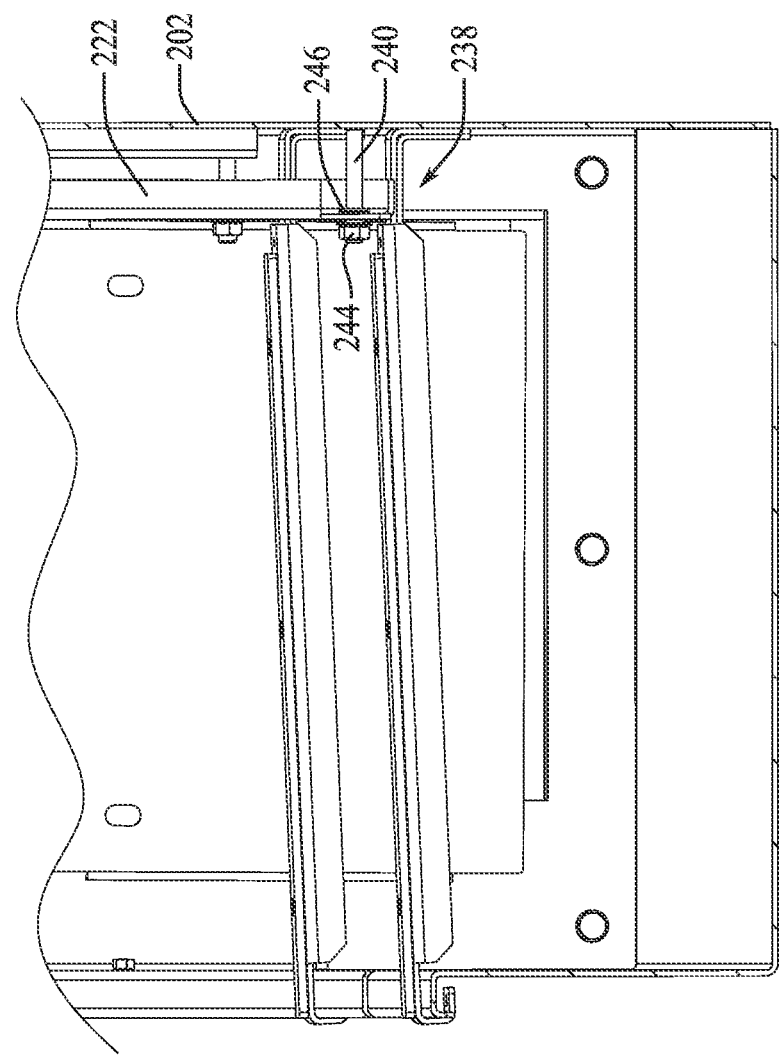
FIG. 16 shows a side view of a fastening assembly in an installed configuration with the back panel.

FIG. 14 shows a perspective view of the enclosure 200 of FIG. 12 after fastening assemblies 238 have been appropriately installed. Each fastening assembly 238 includes a bolt 240, a washer 242, and a nut 244. The bolts 240 are coupled (e.g., welded) to the back wall 202 of the enclosure 200 at specific locations. After the bolts 240 are aligned with and inserted into respective holes 224 of the back panel 222, the bolts 240 can be inserted into respective washers 242. Then, a respective nut 244 can be threadingly engaged with the bolt 240 and fastened accordingly, with a collar 246 on the bolts 240 blocking translation of the back panel 222 toward the back wall 202 (see also FIGS. 15 and 16).

Figure 17:
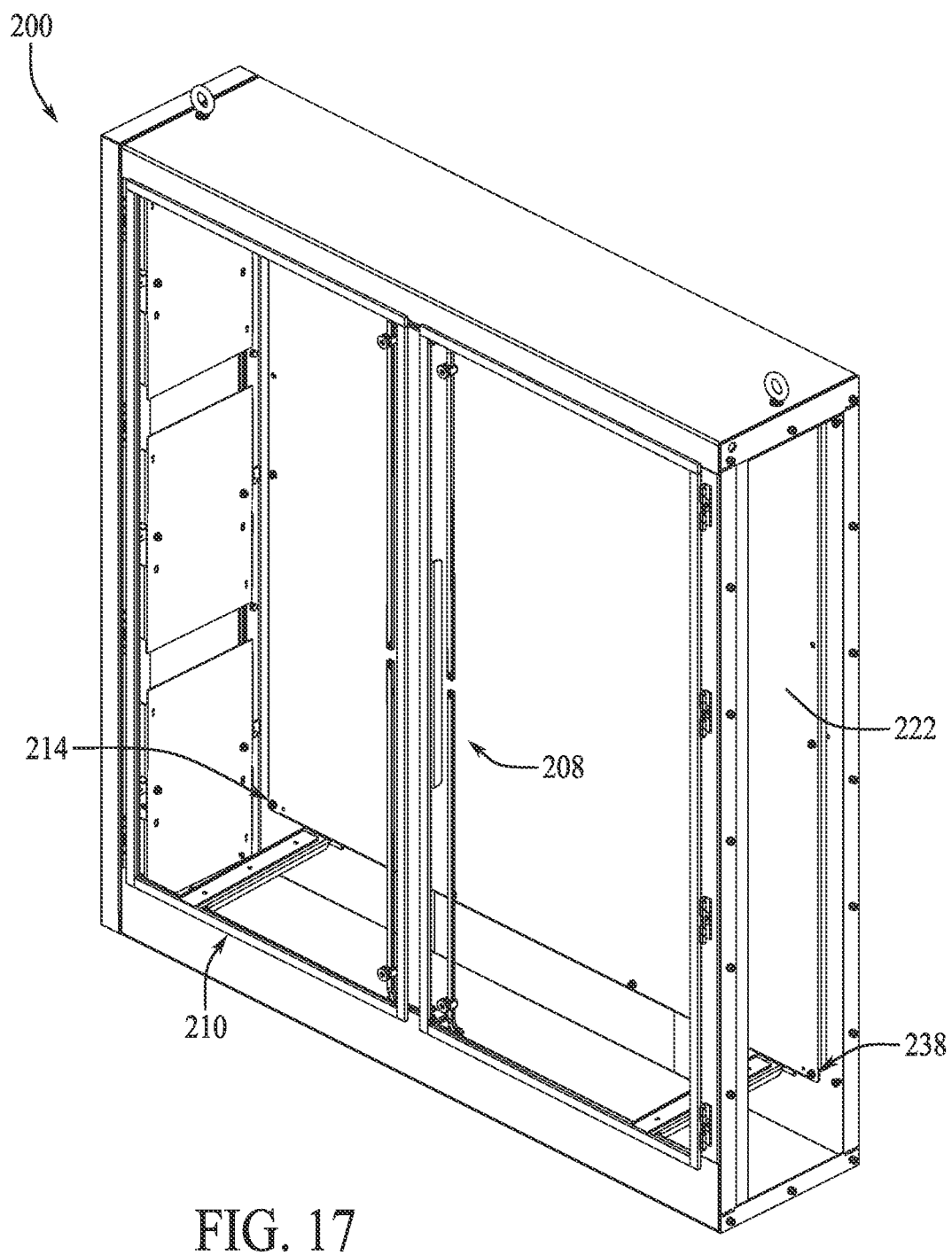
FIG. 17 shows an isometric view of the enclosure of FIG. 14 with a center post installed.

Once installation of the panel 222 has been completed, the center post 208 can be re-installed, as shown in FIG. 17. The glider tools 100 can then be readily lifted out of the enclosure 200, including after the panel 222 has been secured with the bolts 240, such as by reversing the installation process discussed above.

Figure 18:
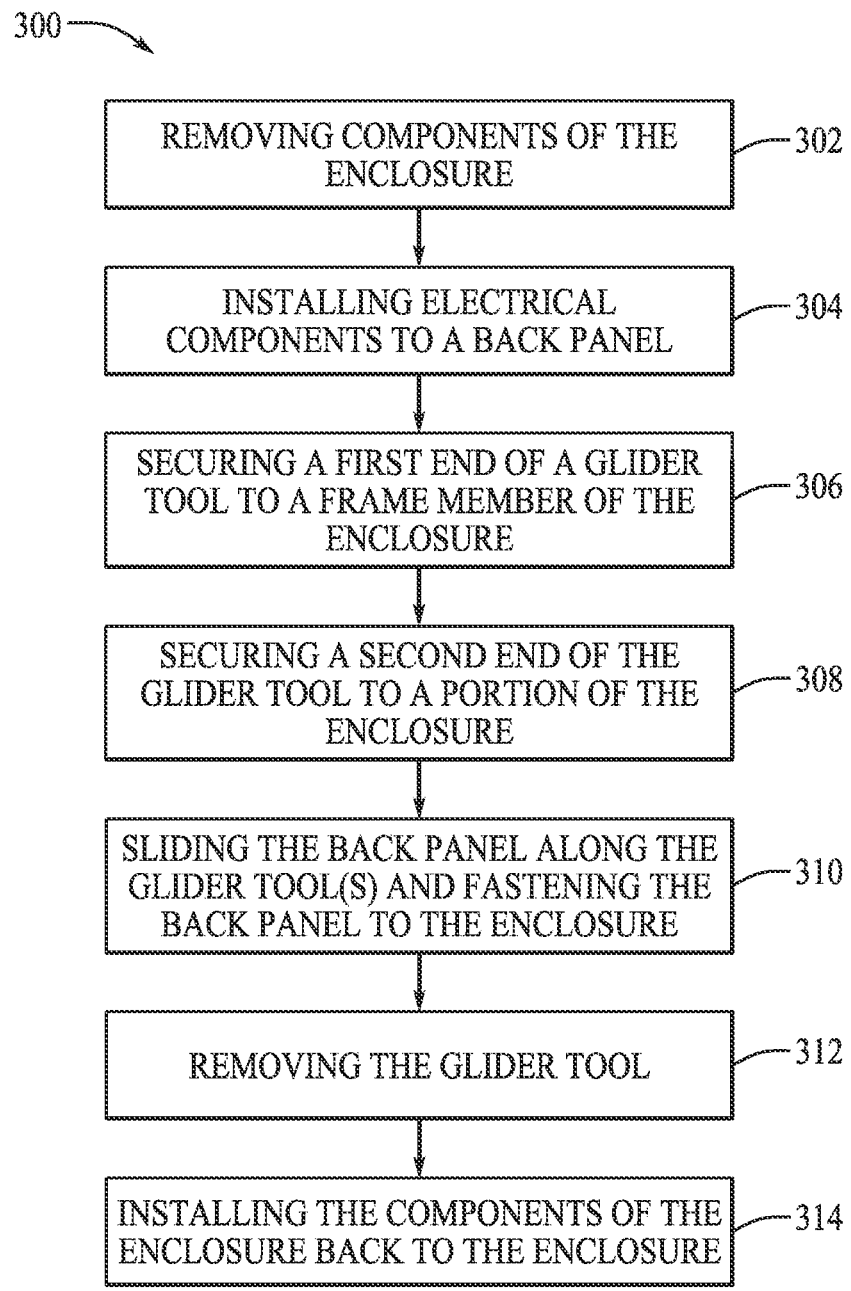
FIG. 18 shows a flowchart of a process for installing (or removing) a back panel of an enclosure.

FIG. 18 shows a flowchart of a process 300 for installing (or removing) a back panel of an enclosure, which can include any of the previously described components (e.g., the glider tool(s) 100, the enclosure 200, etc.). At 302, the process 300 can include removing components of the enclosure. For example, this can include removing components of the enclosure that would otherwise obstruct installing or removing the back panel of the enclosure. As a more specific example, this can include removing a door (or multiple doors) from the enclosure, and removing a center post of the enclosure (e.g., after the door(s) have been removed).

At 304, the process 300 can include installing electrical components to the back panel of the enclosure. For example, this can include fastening (and securing) electrical components to the back panel of the enclosure.

At 306, the process 300 can include securing a first end of a glider tool to a frame member of the enclosure. For example, this can include coupling the first end of the glider tool to the (front) frame member of the enclosure without the use of fasteners (e.g., and where the first end of the glider tool is configured to be removably coupled to the frame member of the enclosure). In some cases, this can include engaging a hook of the glider tool that is positioned at the first end of the body of the glider tool with the frame member of the enclosure. In some cases, this can include inserting a ledge of the glider tool into a channel of a peripheral flange of the frame member of the enclosure, and pivoting the second end of the glider tool downwardly towards the back wall of the enclosure to contact the peripheral flange with the hook. In some cases, this can include lifting the second end of the glider tool upwardly, and with the second end lifted upwardly, sliding glider tool along the frame member (e.g., the peripheral flange) until a desired position is reached.

At 308, the process 300 can include securing (e.g., without the use of threaded fasteners) a second end of the glider tool to a portion of the enclosure (e.g., a bracket coupled to a rear wall of the enclosure). For example, this can include securing the second end of the glider tool to a rear bracket of the enclosure without the use of threaded fasteners (e.g., and where the second end of the glider tool is configured to be removably coupled to the rear bracket, or other portion, of the enclosure). In some cases, this can include pivoting the second end of the glider tool towards the back wall of the enclosure (e.g., about the first end of the glider tool, such as when the hook of the first end of the glider tool is in contact with the frame member of the enclosure). In some cases, this can include contacting the second end of the body of the glider too with the rear bracket, and positioning a first flange of the glider tool and a second flange of a glider tool relative to the rear bracket so that the rear bracket is positioned between the first flange and the second flange. In some cases, this can include engaging an engagement feature of the glider tool with a feature of the rear bracket of the enclosure. For example, this can include inserting a protrusion (of the glider tool or the rear bracket) through an aperture (of the other of the glider tool or the rear bracket).

In some embodiments, such as when more than one glider tool is present, another glider tool can be installed according to the process 300. For example, the anther glider tool can follow blocks 306, 308 of the process 300.

At 310, the process 300 can include sliding the back panel (e.g., through the front opening of the enclosure) along the glider tool (or multiple glider tools) toward or away from the back wall of the enclosure. In some cases, during removal of the back panel, for example, the process 300 can include unfastening the back panel from the enclosure (E.g., the rear wall of the enclosure). In other cases, such as during installation, for example, this can include sliding the back panel along the body of the glider until the back panel is supported on the rear bracket and is removed from contact with an upper surface of the body of the glider tool. In some cases, this can include sliding the back panel along the sliding layer of the glider tool until the back panel is removed from contact with the sliding layer, and further sliding the back panel along the body of the glider tool until the back panel is removed from contact with an upper surface of the body of the glider tool that does not include the sliding layer. In some cases, this can include sliding the back panel along the body of the glider tool and the body of the another glider tools simultaneously, until the back panel is supported on the rear bracket, the back panel is supported on the another bracket, and the back panel is removed from contact with the upper surface of the body of the glider tool and with an upper surface of the body of the another glider tool.

At 310, the process 300 can also include fastening the back panel of the enclosure to the enclosure. For example, this can include aligning a hole (or holes) of the back panel with corresponding hole (or holes) of the back wall of the enclosure and fastening, such as with threaded fastener(s), the back panel to the back wall of the enclosure.

At 312, the process 300 can include removing the glider tool from the enclosure (e.g., after the back panel has been supported on the rear bracket, or the back panel is fastened to the enclosure). For example, this can include pivoting the glider tool about the first end (e.g., with the hook) by lifting the second end of the glider tool upwardly, and disengaging a hook of the glider tool from the frame member of the enclosure. In some cases, after removal of the glider tool, the glider tool can be stored on a storage structure. For example, this can include inserting a protrusion of a storage structure through a hole in the glider tool. In some cases, such as when multiple glider tools are present, this can include removing each glider tool from the enclosure.

At 314, the process 300 can include installing the components (e.g., that were removed at removed at the block 302) of the enclosure back to the enclosure (e.g., after the glider tool(s) have been removed. For example, this can include installing a center post to the enclosure, and can include installing a door (or doors) to the enclosure (e.g., after installing the center post).

Although some of the discussion above is framed in particular around systems, such as the glider tools 100, and the enclosure 200, those of skill in the art will recognize therein an inherent disclosure of corresponding methods of use of the disclosed systems. Correspondingly, some embodiments of the disclosure can include methods of using a glider tool with an enclosure for the installation of a back panel for an enclosure.

Thus, embodiments of the disclosure can provide improved systems and methods for installing a back panel of an enclosure. More specifically, the glider tool, and methods of using the glider tool with the enclosure, allow for easy installation of a back panel of an enclosure.

The previous description of the disclosed embodiments is provided to enable any person skilled in the art to make or use the invention. Various modifications to these embodiments will be readily apparent to those skilled in the art, and the generic principles defined herein may be applied to other embodiments without departing from the spirit or scope of the invention. Thus, the invention is not intended to be limited to the embodiments shown herein but is to be accorded the widest scope consistent with the principles and novel features disclosed herein.

The invention claimed is:

1. A method for installing a back panel of an enclosure, the method comprising:
   aligning a glider tool in an installed configuration,
      wherein the glider tool includes a body having a first surface, a second surface opposite the first surface, a first end, and a second end opposite the first end, the body defining a length that extends from the first end to the second end, and
      wherein when the glider tool is installed in the installed configuration, the first end of the body engages a front frame member of the enclosure, and the second end of the body is in contact with the enclosure, so that a gap is located between the second end of the body and a back wall of the enclosure, the gap being larger than the thickness of the back panel of the enclosure;
   sliding the back panel along the glider tool until the back panel is within the gap; and
   removing the glider tool from the enclosure while the back panel is within the gap.

2. The method of claim 1, wherein aligning the glider tool in the installed configuration includes:
   removably coupling the first end of the body to the front frame member of the enclosure, and
   removably coupling the second end of the body to a bracket of the enclosure, the bracket being coupled to the back wall of the enclosure.

3. The method of claim 2, wherein the first end of the body is removably coupled to the front frame member of the enclosure without the use of a threaded fastener, and
   wherein the second end of the body is removably coupled to the bracket of the enclosure without the use of a threaded fastener.

4. The method of claim 2, further comprising:
   engaging a hook at the first end of the body with the front frame member of the enclosure that defines an opening of the enclosure with the hook extending to an exterior of the opening.

5. The method of claim 2, wherein the glider tool further includes:
   a first flange extending along and away from a first longitudinal side of the body in a first direction; and
   a second flange extending along and away from a second longitudinal side of the body in the first direction, the second longitudinal side being opposite the first longitudinal side; and
   wherein when the second end of the body is removably coupled to the bracket of the enclosure, the first flange and the second flange extend along opposing edges of the bracket so that the bracket is positioned between the first flange and the second flange.

6. The method of claim 4, wherein the hook includes an arm extending downwardly from the first end of the body.

7. The method of claim 6, wherein, when the hook is engaged with the front frame member of the enclosure, the arm extends to the exterior of the opening of the enclosure so that the glider tool is slidable along the front frame member of the enclosure.

8. The method of claim 4, wherein the glider tool further includes an aperture directed-through the hook, the aperture being configured to receive at least one of a hook, a pin, or a protrusion of a storage structure, when the glider tool is not in use.

9. The method of claim 1, wherein the glider tool further includes a sliding layer positioned on top of and extending along the top surface of the body, the sliding layer being at least one of:
   a liquid layer; or
   a solid layer that is separate from the body of the glider tool;

wherein the sliding layer has a lower sliding coefficient of friction than a sliding coefficient of friction of the top surface of the body; and wherein the sliding layer slidably supports the back panel, for the back panel to be slid along the body from the front opening of the enclosure to the back wall of the enclosure.

10. The method of claim 9, wherein the sliding layer is a solid layer that is separate from the body of the glider tool, wherein the body is a glider body, wherein the sliding layer defines a support body, the support body being coupled to the top surface of the glider body using a fastener, wherein the fastener is a threaded fastener.

11. The method of claim 9, wherein the sliding layer extends along the entire length of the body defined between the first end of the body and the second end of the body, or the sliding layer extends from the first end of the body, along the length of the body, and stops short of extending to the second end of the body to define an exposed portion of the top surface of the body.

12. The method of claim 11, wherein the glider tool further includes an engagement feature that contacts and engages with a feature of a bracket of the enclosure, in the installed configuration, wherein the engagement feature is a hole, and wherein the feature of the bracket is a protrusion.

13. A method for installing a back panel of an enclosure, the method comprising:

installing a glider tool in the enclosure in an installed configuration, in which the glider tool seated on a bracket that is secured to and extends forward from a back wall of the enclosure;

with the glider tool in the installed configuration, installing the back panel in the enclosure by sliding the back panel along the glider tool, wherein, the glider tool includes a body having a top surface and a bottom surface; and a sliding layer positioned on top of and extending along the top surface of the body, the sliding layer being at least one of:

a liquid layer; or a solid layer that is separate from the body of the glider tool;

the sliding layer having a lower sliding coefficient of friction than the sliding coefficient of friction of the top surface of the body; and the sliding layer slidably supporting the back panel, as the back panel is slid along the body from a front opening of the enclosure to be supported by the bracket, and with the back panel supported on the bracket, removing the glider tool from the enclosure.

14. The method of claim 13, wherein the sliding layer is a solid layer that is separate from the body of the glider tool, wherein the body is a glider body, wherein the sliding layer defines a support body, the support body being coupled to the top surface of the glider body using a fastener.

15. The method of claim 13, wherein the sliding layer extends along an entire length of the body defined between a first end of the body and a second end of the body, or the sliding layer extends from a first end of the body, along the length of the body, and stops short of extending to the second end of the body to define an exposed portion of the top surface of the body, and wherein the exposed portion of the top surface of the body includes an engagement feature that contacts and engages with a feature of the bracket of the enclosure when the glider tool supports the back panel, wherein the engagement feature is a hole, and wherein the feature of the bracket is a protrusion.

16. The method of claim 13, wherein the body of the glider tool defines a first end with a hook and a second end opposite of the first end, a first flange extending along and away from a first longitudinal side of the body in a first direction, a second flange extending along and away from a second longitudinal side of the body in the first direction, the second longitudinal side being opposite the first longitudinal side; and wherein, to slidably support the back panel:

the first end is removably coupled to a frame member that defines an opening of the enclosure without the use of threaded fasteners, the second end is removably coupled to the bracket of the enclosure, without the use of fasteners, and the hook engages with the frame member of the enclosure; and with the second end of the body contacting the bracket of the enclosure, the bracket is positioned between the first flange and the second flange.

17. The method of claim 13, wherein, when the glider tool is in the installed configuration: a first end of the body engages a front frame member of the enclosure, a second end of the body is in contact with the bracket of the enclosure, and a gap is located between the second end of the body and the back wall of the enclosure, the gap being larger than the thickness of the back panel of the enclosure, and wherein the gap provides a clearance relative to a back wall of the enclosure to permit the back panel to seat on the bracket between the body and the back wall.

* * * * *